(12) United States Patent
Kursula

(10) Patent No.: US 8,775,847 B2
(45) Date of Patent: Jul. 8, 2014

(54) METHOD AND APPARATUS TO BOOST MASS MEMORY PERFORMANCE GIVEN POWER SUPPLY AVAILABILITY

(75) Inventor: Mikko Sami Tapani Kursula, Tampere (FI)

(73) Assignee: Memory Technologies LLC, Kirkland, WA (US)

( * ) Notice: Subject to any disclaimer, the term of this patent is extended or adjusted under 35 U.S.C. 154(b) by 283 days.

(21) Appl. No.: 12/928,533

(22) Filed: Dec. 14, 2010

(65) Prior Publication Data

US 2012/0151241 A1 Jun. 14, 2012

(51) Int. Cl.
*G06F 1/00* (2006.01)
*G06F 11/30* (2006.01)
*G06F 13/00* (2006.01)
*G06F 11/00* (2006.01)

(52) U.S. Cl.
USPC .............. 713/340; 713/300; 711/118; 714/14

(58) Field of Classification Search
None
See application file for complete search history.

(56) References Cited

U.S. PATENT DOCUMENTS

| 6,035,347 | A * | 3/2000 | Beardsley et al. | 710/52 |
| 7,395,452 | B2 * | 7/2008 | Nicholson et al. | 714/22 |
| 7,596,643 | B2 * | 9/2009 | Merry et al. | 710/56 |
| 7,761,681 | B2 * | 7/2010 | Jewell et al. | 711/165 |
| 8,055,846 | B2 * | 11/2011 | Schwarz et al. | 711/118 |
| 2005/0279165 | A1 | 12/2005 | Yuasa | 73/489 |
| 2006/0136758 | A1 | 6/2006 | Yoon | 713/300 |
| 2006/0139069 | A1 | 6/2006 | Frank et al. | 327/143 |
| 2006/0152842 | A1 | 7/2006 | Pasolini et al. | 360/75 |
| 2007/0120528 | A1 | 5/2007 | Burgan et al. | 320/114 |
| 2007/0250732 | A1 | 10/2007 | Wong et al. | 713/324 |
| 2010/0122023 | A1 | 5/2010 | Shih | 711/104 |
| 2011/0252205 | A1 * | 10/2011 | Rege | 711/154 |

FOREIGN PATENT DOCUMENTS

JP 6012153 A 1/1994
KR 100768856 B1 10/2007

* cited by examiner

*Primary Examiner* — Ji H Bae
(74) *Attorney, Agent, or Firm* — Lee & Hayes, PLLC

(57) ABSTRACT

Reliability of a power supply is assessed, such as for example considering one or more of the following: whether a host device is experiencing fast acceleration; whether a portable power supply has sufficient energy to meet current needs; whether a battery or removable memory cover is in place; and whether a software failure within the host device is imminent. In dependence on the assessed reliability, there is a selection made between a first mode and a second mode for operating a mass memory. The first mode comprises better data retention than the second mode for the case that the power supply is interrupted, and the second mode comprises faster data transfer than the first mode for the case that the power supply is not interrupted. In one embodiment the first and second mode buffers write data utilizing respective non-volatile (flash) and volatile (DRAM) memory.

14 Claims, 3 Drawing Sheets

METHOD AND APPARATUS TO BOOST MASS MEMORY PERFORMANCE GIVEN POWER SUPPLY AVAILABILITY

TECHNICAL FIELD

The exemplary and non-limiting embodiments of this invention relate generally to computer memory system operations, and particularly relate to such operations in portable electronic devices which are subject to unintentional complete loss of electrical power.

BACKGROUND

Computer readable memory is in wide and varying use among portable devices such as for example mobile terminals, navigation systems, portable media players, and smartphones which incorporate many of those functions into a single handheld device. One memory technology utilized by many specific implementations of these portable devices is a memory card such as a removable memory module card MMC and/or an embedded memory module card eMMC, which is a trademark of the MultiMediaCard Association (MMCA). As used herein, removable memory card or module means removable from a host device by an end user without dis-assembling the host device. Memory module cards, whether removable or embedded, are referred to herein as MMCs. Operation of MMCs is largely but not entirely directed by published standards such as the MMC System Specification v4.1 and 4.2, such as to meet advertised interface speeds of 52 MB/sec at an interface voltage of 1.8v or 3.3v.

A problem exists in such MMC devices in that the continuous electrical power supply from the host portable device into which they are integrated might be interrupted, such as for example if the device were physically dropped and the battery dislodged due to the impact. This has led to strict requirements for the MMC device itself so as to withstand data corruption despite a sudden loss of electrical power. Meeting these requirements has resulted in the performance of the MMC component being degraded somewhat; there is an engineering tradeoff between memory speed and data reliability in this instance where power supply might be interrupted. This is because the internal operations of the MMC are limited so as to assure the required data reliability under the above conditions of power loss.

Current solutions to assure the above data reliability for mobile device mass memory consider that power supply can be lost at any moment, as in the above dislodged battery scenario. In many implementations this means that data storage and buffering inside the MMC component itself is implemented using non-volatile memory technology (by example, NAND logic in at least eMMCs). A performance degradation arises because non-volatile memory technology typically has much lower performance (by example, write speeds for data) than volatile memories such as dynamic random access DRAM memory technologies.

There are some prior approaches to address the problem of data loss from a dislodged battery. US Patent Publication 2010/0122023 describes that if it is determined that a device is in a free fall situation data is transferred from the random access memory RAM using a non-volatile RAM, similar to that noted above. US Patent Publication 2007/020528 describes that a memory write from a first memory for non-critical data to a second memory for critical data is prevented if the host device is in free fall. US Patent Publication 2005/0279165 describes that a data transfer stop instruction is issued if it is determined that the device is in free fall.

Embodiments of the invention detailed below are directed to improving performance/speed of the MMC, and as such may be utilized in conjunction with the above solutions for preventing data loss in the event of complete power interruption. The below embodiments are exemplary and non-limiting, and the broader teachings herein are not limited only to specifically MMC memory but to any type of mass memory implemented in a device which has different modes of performance and which is subject to interruption of continuous electrical power.

SUMMARY

In a first aspect thereof the exemplary embodiments of this invention provide a method comprising: assessing power supply reliability; and in dependence on the assessed reliability, selecting between a first mode and a second mode for operating a mass memory. In this first aspect the first mode comprises better data retention than the second mode for the case that the power supply is interrupted, and the second mode comprises faster data transfer than the first mode for the case that the power supply is not interrupted.

In a second aspect thereof the exemplary embodiments of this invention provide an apparatus comprising at least one processor and at least one memory storing computer program code and a mass memory. The at least one memory and the computer program code are configured, with the at least one processor, to cause the apparatus at least to: assess power supply reliability; and in dependence on the assessed reliability, select between a first mode and a second mode for operating the mass memory. In this second aspect the first mode comprises better data retention than the second mode for the case that the power supply is interrupted, and the second mode comprises faster data transfer than the first mode for the case that the power supply is not interrupted.

In a third aspect thereof the exemplary embodiments of this invention provide a computer-readable memory bearing computer program code embodied therein for use with at least one processor. The computer program code comprises: code for assessing power supply reliability; and code for selecting, in dependence on the assessed reliability, between a first mode and a second mode for operating a mass memory. In this third aspect the first mode comprises better data retention than the second mode for the case that the power supply is interrupted, and the second mode comprises faster data transfer than the first mode for the case that the power supply is not interrupted.

In a fourth aspect thereof the exemplary embodiments of this invention provide an apparatus comprising determining means and selecting means. The determining means is for assessing power supply reliability. The selecting means is for selecting, in dependence on the assessed reliability, between a first mode and a second mode for operating a mass memory. In this fourth aspect the first mode comprises better data retention than the second mode for the case that the power supply is interrupted, and the second mode comprises faster data transfer than the first mode for the case that the power supply is not interrupted. In a specific embodiment of this fourth aspect the assessing means and the determining means comprises at least one processor, and the mass memory comprises an embedded mass memory card.

DETAILED DESCRIPTION

Figure 1:
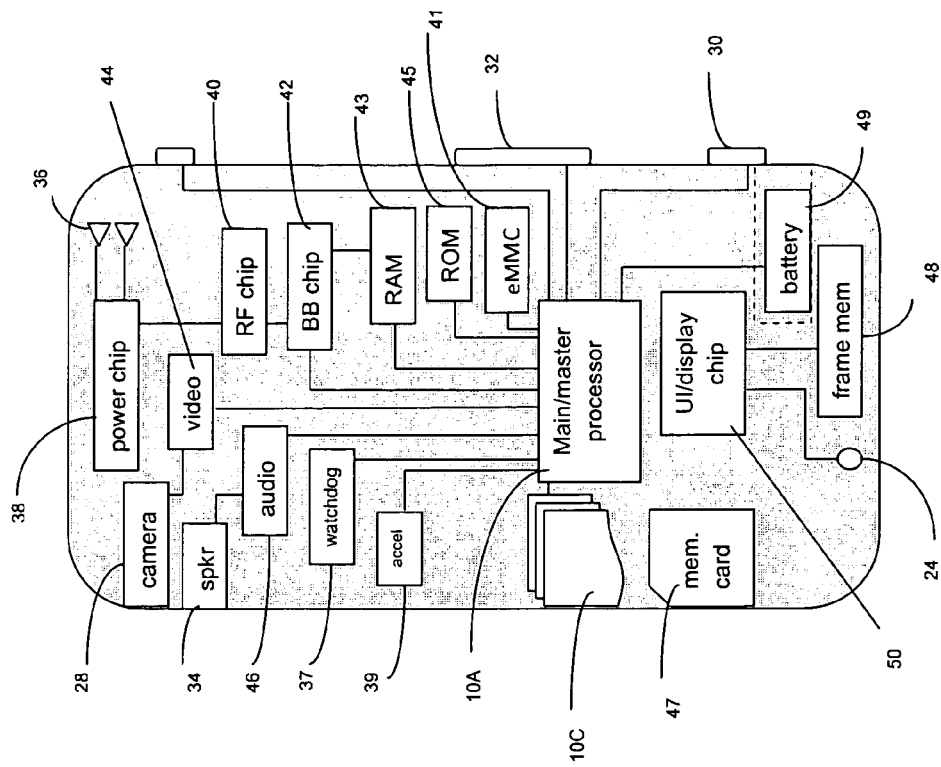
FIG. 1 is a simplified block diagram of various electronic devices that are suitable for use in practicing the exemplary embodiments of this invention.
Figure 1:
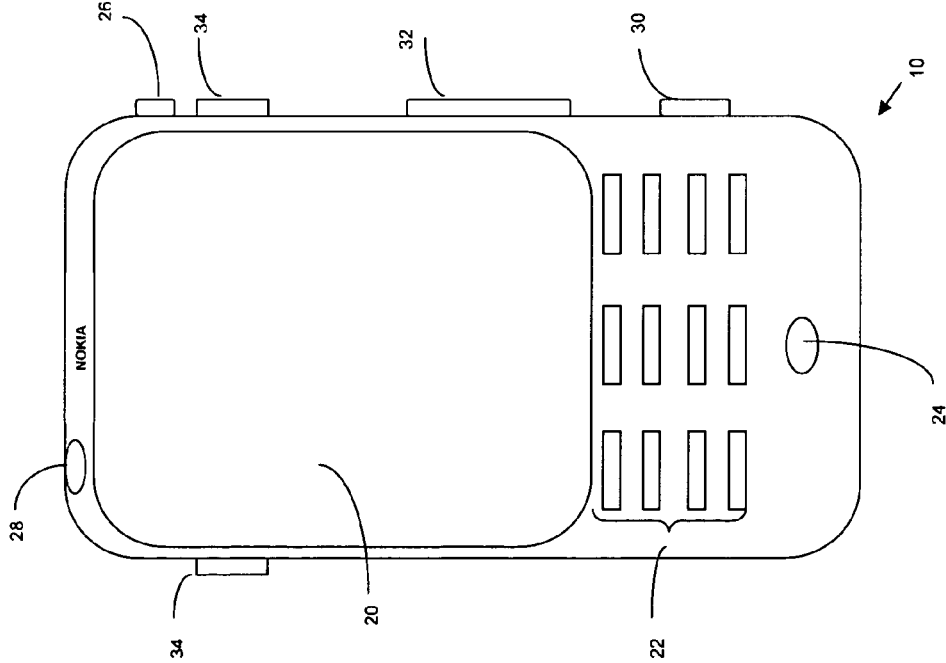

FIG. 1 is an exemplary but non-limiting embodiment of a host device in which aspects of the invention may be practiced to advantage. The host device 10 is illustrated at FIG. 1 as a smartphone, generically referred to as a portable electronic device which may by size be considered a handheld device in which the invention may be embodied. Other exemplary host devices may or may not include cellular-type radios or any radios at all; such examples including a camera, a digital gaming or music device, a personal digital assistant, a navigation (GPS) device, an internet appliance, and laptop and palmtop personal computers, to name a few.

At FIG. 1 the host device 10 has a graphical display interface 20 and a user interface 22 illustrated as a keypad but understood as also encompassing touch-screen technology at the graphical display interface 20 and voice-recognition technology received at the microphone 24. A power actuator 26 controls the device being turned on and off by the user. The exemplary host device 10 may have a camera 28 which is shown as being forward facing (e.g., for video calls) but may alternatively or additionally be rearward facing (e.g., for capturing images and video for local storage). The camera 28 is controlled by a shutter actuator 30 and optionally by a zoom actuator 32 which may alternatively function as a volume adjustment for the speaker(s) 34 when the camera 28 is not in an active mode. Buffering video is one environment in which embodiments of these teachings are expected to prove particularly advantageous.

Within the sectional view of FIG. 1 are seen multiple transmit/receive antennas 36 that are typically used for cellular or other (e.g., WLAN, Bluetooth, GPS) wireless communications. There is a radio front end illustrated as a power chip 38 disposed on a printed wiring board which may also embody various transmitters and receivers for different radio technologies. Depending on whether transmitting or receiving, the power chip 38 controls power amplification on the channels being transmitted from the antenna(s) 36, and amplifies the received signals which are then output to the radio-frequency (RF) chip 40 that demodulates and downconverts the received signal for baseband processing. The baseband (BB) chip 42 detects the signal which is then converted to a bit-stream and finally decoded.

Signals to and from the camera 28 pass through an image/video processor 44 which encodes and decodes the various image frames. A separate audio processor 46 may also be present to control signals to and from the speakers 34 and the microphone 24. The graphical display interface 20 is refreshed from a frame memory 48 as controlled by a user interface chip 50 which may process signals to and from the display interface 20 and/or additionally process user inputs from the keypad 22 and elsewhere.

Throughout the apparatus are various memories, by non-limiting example random access memory RAM 43 nonvolatile memory, read only memory ROM 45, one or more embedded memory cards eMMC 41 and removable memory such as the illustrated MMC memory card 47. Various computer programs 10C for operating various aspects of the host device, including computer program instructions for operating according to these teachings, are stored in these various memories. In an embodiment there is a mass memory, such as for example an MMC 41 or 47, which includes at least two buffers of different type: one is a volatile memory buffer (such as dynamic RAM or DRAM, and static RAM or SRAM) and the other is a non-volatile memory buffer (such as flash memory, magnetoresistive RAM, and magnetic and optical disc). In other embodiments the different buffers of different memory types need not be co-located on a same chip/module with the mass memory to which the buffered write data is to be written or from where the buffered write data was copied.

In an embodiment the MMC 41 or 47 also includes an on-chip processor which controls which of those various buffers is used at any given time for write data, and the on-chip processor may switch which buffer is in use in response to a command received from the main or master processor 10A of the host device 10. The write data may be buffered for writing to a semi-permanent storage within the mass memory 41, 47, or it may be buffered to write to some other memory within the host device 10 such as for example temporary memories associated with storing parameters for operating a radio or some peripheral hardware such as for example the camera and/or graphical display screen 20 for video collection and display purposes. As detailed by non-limiting example below, it is the main/master processor 10A which collects various inputs to assess the reliability of the power supply but in other embodiments the on-chip processor within the mass memory 41, 47 may collect those inputs and make the power supply reliability assessment itself. Embodiments of the invention may be implemented with respect to the eMMC 41 or the removable memory card 47 or other discrete memory modules of the host device 10. The single host device 10 may exhibit multiple implementations of the embodiments detailed below, one for each of two or more distinct memory modules or units.

There is also within the host device 10 a software watchdog 37 which is detailed below in a non-limiting embodiment as a counter implemented in stored software, and there is further an accelerometer 30 also detailed below. Such a software watchdog 37 is shown separately at FIG. 1 for clarity of description, but in an embodiment it may be implemented in the mass memory (MMC 41 or 47) which is selectively operated according to these teachings. All of these components within the host device 10 are normally powered by a portable power supply such as a galvanic battery 49.

The aforesaid processors 38, 40, 42, 44, 46, 50, and the on-chip processor within the MMC 41 or 47, if embodied as separate entities in the host device 10, may operate in a slave relationship to the main processor 10A, which may then be in a master relationship to them. Any or all of these various processors of FIG. 1 may access one or more of the various memories or only a limited set of them. Note that the various chips (e.g., 38, 40, 42, etc.) that were described above may be combined into a fewer number than described and, in a most compact case, may all be embodied physically within a single chip having one or more processors 10A. The various processors may be of any type suitable to the local technical environment, and may include one or more of general purpose computers, special purpose computers, microprocessors, digital signal processors (DSPs), processors based on a multicore processor architecture, application specific integrated circuits ASICs, and the specific MMC 41 or 47 on-chip processor noted above, as non-limiting examples.

In more general terms the host device 10 may be considered to include at least one controller, such as a computer or a data processor (DP) 10A or other of the described processors, a memory medium tangibly embodied as a computer readable memory (MEM) that stores a program of computer program code (PROG) 10C, and a mass memory (eMMC 41, removable memory card 47) which may or may not be the same as the memory storing the described computer program code 10C. That is, the computer program code 10C may be stored within the MMC 41 or 47 itself and direct operations for how the MMC 41 or 47 operates, or the computer program code 10C may reside in some other memory of the host device 10 apart from the mass memory which the program code 10C controls. Wherever stored, at least one of the PROGs 10C is assumed to include program instructions that, when executed by the associated DP, enable the host device 10 to operate in accordance with the exemplary embodiments of this invention, as will be discussed below in greater detail. That is, the exemplary embodiments of this invention may be implemented at least in part by stored computer software executable by at least one processor of the host device 10 or by hardware, or by a combination of stored software and hardware (and/or stored firmware).

In view of the problem set forth in the background section above concerning withstanding data corruption for the case of a sudden loss of electrical power the inventor has determined that if DRAM or other volatile memory technology could be used to buffer data inside the exemplary MMC component 41 or 47, the overall performance could be improved for at least those times at which there is some guarantee of continuous power supply availability. In exemplary embodiments of the invention, the trade-off is that the mass memory is operated in the mode for better performance (a second mode, e.g., using a volatile memory as the data buffer) for the case in which this guarantee can be met and in the mode for better data reliability (a first mode, e.g., using a non-volatile memory as the data buffer) for the case in which this guarantee cannot be met. Said another way, exemplary embodiments of the invention provide a way to guarantee the availability of power supply to the MMC 41 or 47 or other mass memory component, and there is a selection of which mode to use for operating the memory (e.g., which type of memory to use for buffering data) and the selection depends on whether or not that power supply guarantee is met.

In exemplary embodiments of the invention there are one or more sensors and/or context signals which are used to determine when the mass memory power supply can be guaranteed. Such a guarantee can be time-limited, by non-limiting example for a minimum of 100 ms after which inputs of the sensors or context is re-checked and the mode is switched if the status of the power supply guarantee is changed. Volatile buffering of data is typically faster but is prone to data corruption if the power supply is switched off, so it cannot be used when power supply is not guaranteed.

Figure 2:
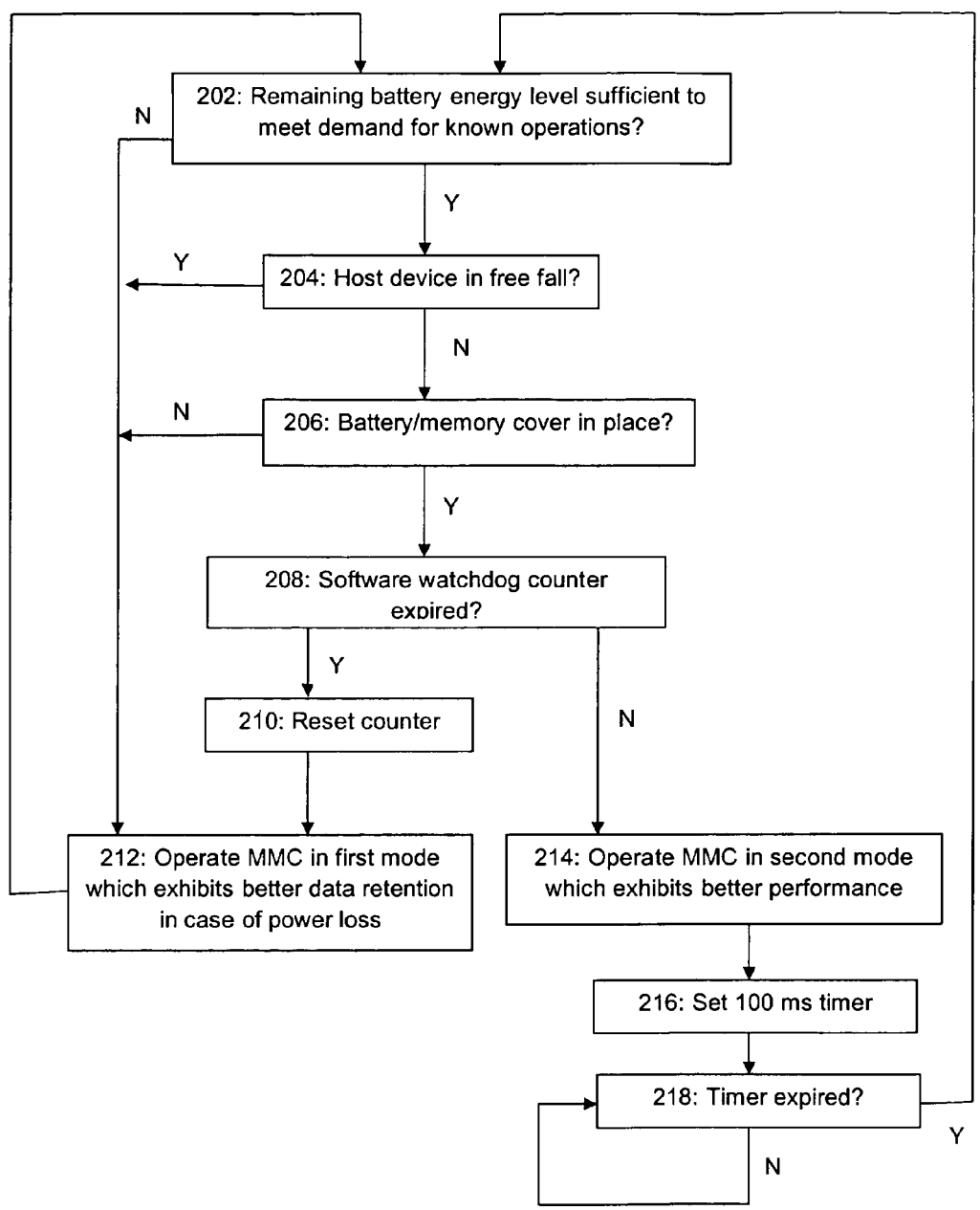
FIGS. 2-3 are each logic flow diagrams illustrating the operation of a method, and a result of execution of computer program instructions tangibly embodied on a computer readable memory, and actions performed by an apparatus configured according to exemplary embodiments of the invention.

FIG. 2 illustrates an exemplary flow diagram for four such sensor/context inputs from which an assessment of the power supply availability is made, and the resulting memory mode. At block 202 it is checked whether the remaining battery energy level is sufficient to meet the current electrical demand in the device 10. If there is insufficient energy then continuity of the power supply is not guaranteed and so block 212 becomes operative and the MMC 41 or 47 is operated in the first mode which exhibits better data retention in event of sudden power loss. If the host device is currently in a charge condition at block 202, the output may default always to the 'yes' output regardless of the value of the residual battery charge.

If energy is sufficient then at block 204 it is checked if the host device is in 'free fall', whether the accelerometer 39 at FIG. 1 senses rapid acceleration of the host device indicating it has been dropped but not yet made impact. Apart from an accelerometer 39 the free fall signal may arise from an inertial sensor or even a ring-laser gyro in certain implementations. If the host device 10 is in free fall, it is assumed the device will soon make impact with the possibility that the battery 49 may become dislodged and disconnected, and so block 212 becomes operative and the MMC 41 or 47 is operated in the first mode as noted above. If the host device is not in free fall, the power supply can be guaranteed for the block 204 criteria and the logic flow of FIG. 3 proceeds to block 206.

At block 206 it is checked whether the battery cover is in place. In an embodiment this input is from a sensor which outputs a 'cover closed' signal if an electrical contact between such a battery cover (shown in dotted line at FIG. 1) and a housing of the host device 10 is closed, and otherwise outputs a 'cover open' signal. Other sensor implementations may provide similar such signals, such as an optical distance sensor or a mechanical switch spring-loaded to extend when the cover is not in place in combination with an electrical signal indicating position of the spring loaded switch. If the battery cover is not in place at block 206 it is considered that the battery might be suddenly removed and so uninterrupted power supply is not guaranteed, leading to block 212 and the first mode as noted above. If the battery cover is in place the power supply can be guaranteed for the block 206 criteria and the logic flow of FIG. 3 proceeds to block 208.

For the case in which the mass memory is a removable memory card 47, block 206 may be implemented with respect to a cover over that removable memory card 47. If the memory card cover is not in place it can be assumed the memory card 47 itself might be soon removed in which case power delivery to the on-card memory controller cannot be guaranteed. The above examples for detecting whether the battery cover is fully in place and closed may be used also for detecting whether the cover over the removable memory card is fully in place. For the case of a removable memory card 47, block 206 of FIG. 2 may be implemented only for the cover over the removable memory card 47, only for the battery cover, or for both covers in which case power is guaranteed such that block 206 leads to block 208 only if both covers are fully in place.

Block 210 is an input from a software monitor or 'watchdog' 37 which assesses likelihood of a software crash. Even if a software crash is programmed not to interrupt the power supply without manual approval and graceful shutdown of ongoing processes like memory write processes, it is considered that a user might remove the battery 49 in order to resolve such a crash by de-powering and re-powering the device 10. In other embodiments a software crash might cause the device to automatically re-boot without allowing the buffered data to/from the MMC 41 or 47 to be written to its non-volatile destination. In this case re-boot of the entire host device 10 would temporarily interrupt power to the MMC 41 or 47, potentially during a data write process.

In one embodiment this software watchdog 37 is a counter of commands that the memory component MMC 41 or 47 receives from the host software within a preset period of time. If there are no commands received within that preset time period, the MMC component 41 or 47 then assumes there is a potential software problem, concludes that the power supply availability can no longer be guaranteed, and the logic flow of FIG. 2 proceeds to block 212 in which the MMC 41 or 47 is operated in the first mode as noted above. In this case the counter may also be re-set as shown at block 210. If instead the timer does not expire due to incoming software commands prior to timer expiration, then all four of the conditions set forth at blocks 202, 204, 206 and 208 are satisfied for guaranteeing availability of the power supply to the MMC 41 or 47 and instead block 214 becomes operative in which the mass memory MMC 41 or 47 is operated in the second mode which exhibits better performance (faster writing of data) than the first mode by utilizing the volatile buffer (DRAM or SRAM) for memory write data processes.

There may be in an exemplary embodiment a timer associated with the second mode, shown at block 216 as 100 ms which is noted above as a minimum time over which the assessment of power supply availability is valid. This timer value is but one non-limiting example; other suitable values may be utilized. This timer is reset at block 216 once block 214 and the second mode becomes operative from an assessment decision. Once the timer expires at block 218 then the cycle repeats at block 202. The cycle repeats also at block 202 once the assessment finds the power supply cannot be guaranteed at block 212 and the first mode is entered.

In various embodiments, the four criteria at blocks 202, 204, 206 and 208 may be evaluated in the order shown, in a different order, or some or all of them may be evaluated in parallel. In an embodiment only one or a few of those criteria but less than all four are part of the assessment process, and in some embodiments additional criteria beyond those specified at FIG. 2 may be included in the assessment of power supply availability. Further in a fail-safe embodiment, for the case that the input signal from any given criteria is not properly received the default condition is to assume an input which would result in the first mode, in order to satisfy the data retention requirements which may be specified for a given MMC 41 or 47.

The invention as set forth in the above non-limiting exemplary embodiments does not add significant cost to a typical smartphone since all the sensors and context information is typically available already in smartphones currently on the market. In that regard embodiments of this invention may be implemented in existing host devices 10 by a software update or upload which allows the relevant input signals to be assessed in combination as set forth at FIG. 2 and delivered to the mass memory component MMC 41 or 47. For existing smartphones without a cover sensor or an accelerometer for example, the relevant criteria may be excluded from the assessment.

Figure 3:
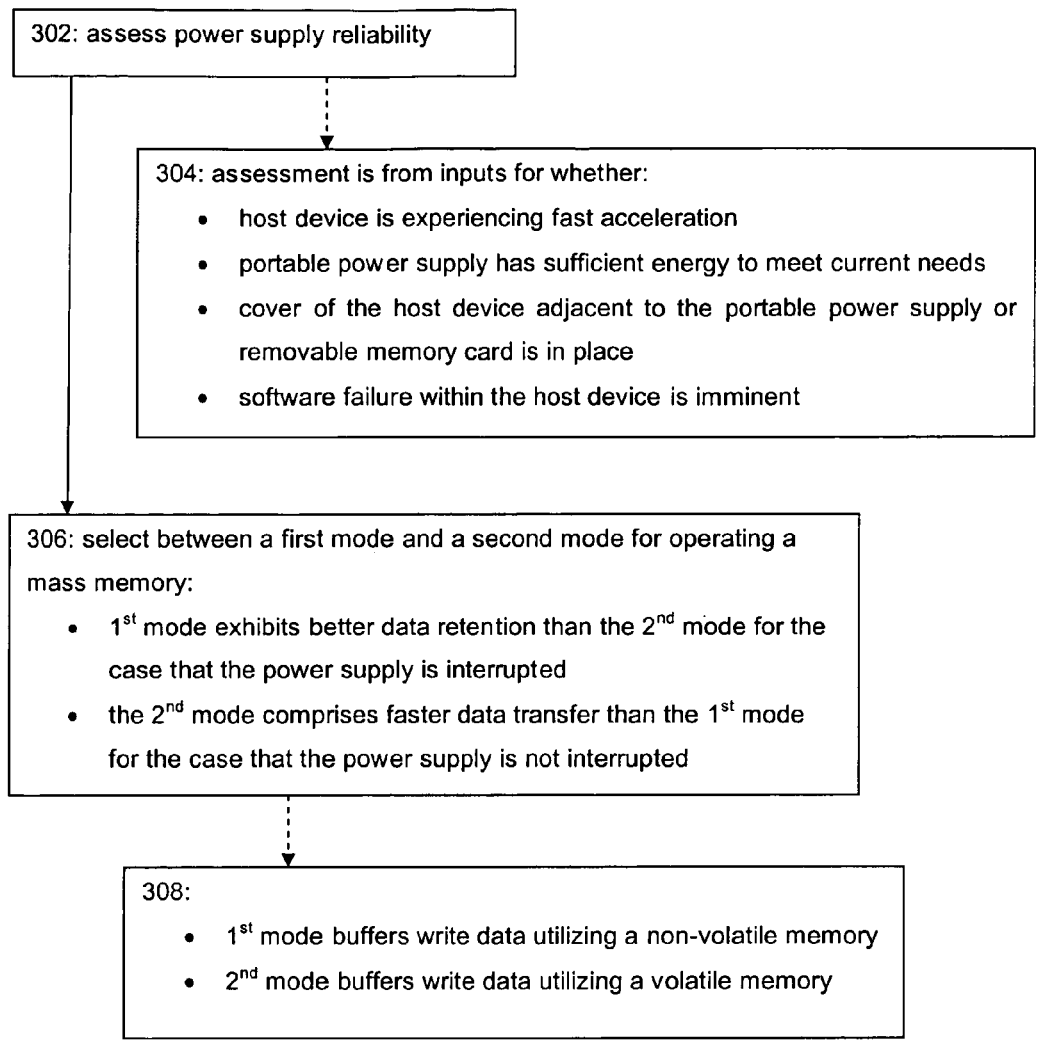

FIG. 3 is a logic flow diagram that illustrates, in accordance with various exemplary embodiments of the invention, the operation of a method, and a result of execution of computer program instructions or computer program code embodied on a computer readable memory, and an apparatus controlled by a processor running computer instructions stored on a memory. Such an apparatus may be the host device 10 itself, or one or more components thereof.

At block 302 there is an assessment done on reliability of a power supply. Such an assessment is detailed by example at blocks 202, 204,206 and 208 of FIG. 2 and summarized at block 304 of FIG. 3. Note that the block 304 criteria are but one exemplary and non-limiting embodiment for how such an assessment might be carried out. As illustrated by the choice between blocks 212 and 214 of FIG. 2, there is in dependence on the assessed reliability a selection made at block 306 between a first mode and a second mode for operating a mass memory, in which the first mode comprises better data retention than the second mode for the case that the power supply is interrupted, and the second mode comprises faster data transfer than the first mode for the case that the power supply is not interrupted. Note that block 306 does not imply that the power supply is or is not interrupted, only that the first and second modes are characterized in regards to relatively better data retention or faster data transfer given the theoretical case if power supply was or was not interrupted.

Block 308 gives a specific exemplary embodiment in that the first mode buffers at least write data utilizing a non-volatile memory and the second mode buffers at least write data utilizing a volatile memory. As noted above, in another exemplary embodiment the mass memory is an embedded mass memory card eMMC 41 or a removable memory card 47, and the non-volatile memory and the volatile memory are each disposed within that same mass memory card 41 or 47. In an embodiment as shown at blocks 216-218 of FIG. 2, the second mode is selected for the case that the assessed reliability is guaranteed for a predetermined minimum time period.

In one particular embodiment the assessment of the reliability of the power supply comprises assessing received inputs which indicate at least three of the following:
whether a host device in which the mass memory is embedded is experiencing fast acceleration;
whether a portable power supply has sufficient energy to meet current needs;
whether a cover of the host device adjacent to the portable power supply (and/or the mass memory for the case the mass memory is removable) is in place; and
whether a software failure within the host device is imminent.

The process elements set forth at FIG. 2 or 3 may be embodied as a memory storing a program of computer readable instructions that when executed by at least one processor result in the actions set forth at FIGS. 2 and/or 3. In another embodiment an apparatus comprises at least one processor and at least one memory storing computer program code; in which the at least one memory and the computer program code are configured with the at least one processor to cause the apparatus at least to perform the elements set forth at FIGS. 2 and/or 3.

In a still further embodiment there is an apparatus comprising determining means for assessing power supply reliability; and selecting means for selecting, in dependence on the assessed reliability, between a first mode and a second mode for operating a mass memory. In this embodiment the first mode comprises better data retention than the second mode for the case that the power supply is interrupted, and the second mode comprises faster data transfer than the first mode for the case that the power supply is not interrupted. In this embodiment the determining means may be a processor which receives inputs from some or all of the various sensors and counters detailed above, and the selecting means may be the same processor or a different one.

The various steps and blocks shown in FIG. 2 or 3 may be viewed as method steps, and/or as operations that result from operation of computer program code, and/or as a plurality of coupled logic circuit elements constructed to carry out the associated function(s). At least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors for receiving the inputs and selecting a mode as detailed above in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

What is claimed is:

1. A method, comprising:
assessing power supply reliability; and
in dependence on the assessed power supply reliability, selecting between a first mode and a second mode for operating a mass memory,
wherein the first mode buffers at least first write data utilizing only a non-volatile memory for a case that a power supply is interrupted, and the second mode buffers at least second write data utilizing only a volatile memory for a case that the power supply is not interrupted, and wherein:
the mass memory is at least one of an embedded mass memory card or a removable mass memory card; and
the non-volatile memory and the volatile memory are each disposed within the at least one of the embedded mass memory card or the removable mass memory card.

2. The method according to claim 1, further comprising selecting the second mode if the assessed power supply reliability indicates that power is guaranteed for a predetermined minimum time period.

3. The method according to claim 1, wherein assessing the power supply reliability comprises assessing one or more inputs that indicate at least one of the following:
whether a host device in which the mass memory is embedded is experiencing rapid acceleration;
whether the power supply has sufficient energy to meet current needs;
whether a cover of the host device adjacent to at least one of the power supply or the mass memory is in place; or
whether a software failure within the host device is imminent.

4. The method according to claim 3, in which the host device comprises a mobile terminal.

5. An apparatus comprising:
assessing means for assessing power supply reliability; and
selecting means for selecting, in dependence on the assessed power supply reliability, between a first mode and a second mode for operating a mass memory, wherein:
the first mode buffers at least first write data utilizing only a non-volatile memory for a case that a power supply is interrupted;
the second mode buffers at least second write data utilizing only a volatile memory for a case that the power supply is not interrupted;
the mass memory comprises at least one of an embedded mass memory card or a removable mass memory card; and
the non-volatile memory and the volatile memory are each disposed within the at least one of the embedded mass memory card or the removable mass memory card.

6. The apparatus according to claim 5, wherein the assessing means assesses the power supply reliability based partly on an input indicating whether a host device in which the mass memory is embedded is experiencing acceleration.

7. The apparatus according to claim 5, wherein the assessing means assesses the power supply reliability based partly on an input indicating whether a portable power supply has sufficient energy to meet current needs.

8. The apparatus according to claim 5, wherein the assessing means assesses the power supply reliability based partly on an input indicating whether a cover of at least one of a power supply or the mass memory is in place.

9. The apparatus according to claim 5, wherein the assessing means assesses the power supply reliability based partly on an input indicating whether a software failure is imminent.

10. A computer-readable memory storing computer program code that, when executed by at least one processor, performs operations comprising:
assessing power supply reliability; and
in dependence on the assessed power supply reliability, selecting between a first mode and a second mode for operating a mass memory,
wherein the first mode buffers at least first write data utilizing only a non-volatile memory for a case that a power supply is interrupted, and the second mode buffers at least second write data utilizing only a volatile memory for a case that the power supply is not interrupted, and wherein:
the mass memory is at least one of an embedded mass memory card or a removable mass memory card; and
the non-volatile memory and the volatile memory are each disposed within the at least one of the embedded mass memory card or the removable mass memory card.

11. The computer readable memory according to claim 10, wherein assessing the power supply reliability comprises assessing the power supply reliability based partly on an input indicating whether a host device in which the mass memory is embedded is experiencing acceleration.

12. The computer readable memory according to claim 10, wherein assessing the power supply reliability comprises assessing the power supply reliability based partly on an input indicating whether a portable power supply has sufficient energy to meet current needs.

13. The computer readable memory according to claim 10, wherein assessing the power supply reliability comprises assessing the power supply reliability based partly on an input indicating whether a cover of at least one of a power supply or the mass memory is in place.

14. The computer readable memory according to claim 10, wherein assessing the power supply reliability comprises assessing the power supply reliability based partly on an input indicating whether a software failure is imminent.

* * * * *